PULSE WIDTH MODULATION TO AMPLITUDE MODULATION CONVERSION CIRCUIT WHICH MINIMIZES THE EFFECTS OF AGING AND TEMPERATURE DRIFT

Filed Aug. 16, 1968

PRIOR ART

INVENTOR
FREDERICK W. CASPARI
BY
ATTORNEYS

United States Patent Office 3,562,673
Patented Feb. 9, 1971

3,562,673

PULSE WIDTH MODULATION TO AMPLITUDE MODULATION CONVERSION CIRCUIT WHICH MINIMIZES THE EFFECTS OF AGING AND TEMPERATURE DRIFT

Frederick W. Caspari, South Bend, Ind., assignor, by mesne assignments, to Allen-Bradley Company, Milwaukee, Wis., a corporation of Wisconsin Filed Aug. 16, 1968, Ser. No. 763,479
Int. Cl. H03k 7/10
U.S. Cl. 332—31 10 Claims

ABSTRACT OF THE DISCLOSURE

The adverse effects on the operation of a pulse width modulation to amplitude modulation conversion circuit caused by noise signals and changes in temperature are considerably minimized by the insertion of circuitry, in accordance with this invention, into the driving circuit of said pulse width modulation to amplitude modulation conversion circuit.

BACKGROUND OF THE INVENTION

This invention relates to pulse width modulation to amplitude modulation conversion circuits, and more particularly to improvements therein.

At present, circuits which are used to convert positive and negative pulses of varying width to an analog signal, whose amplitude varies with the width of the input pulses, usually employ a pair of input transistors in the driving circuit which serve to drive an operational amplifier. Error signals occur in the output of the operational amplifier, due to changes in the characteristics of the transistors caused by aging and temperature variance. Errors in output may also be caused by any imbalance in the input transistors, which should be a matched pair. While these may be matched when initially selected, aging may cause a mismatch to develop subsequently. The static offset of the operational amplifier, or output in the presence of no input, also can cause errors in the output.

OBJECTS AND SUMMARY OF THE INVENTION

An object of this invention is to provide an inexpensive improvement in the driving circuit of a pulse width modulation detector circuit which minimizes adverse effects on the output caused by aging and temperature drift of the driving circuit.

Another object of this invention is to provide a relatively simple improvement in the driving circuit of a pulse width modulation detector circuit which minimizes error signals under all conditions of operation.

Yet another object of the present invention is the provision of a novel and improved circuit for converting pulse width modulation.

These and other objects of the invention are achieved in a pulse width modulation circuit by connecting a first transistor and a second transistor between the driving circuit and the operational amplifier used therein in a manner so that, in the quiescent state of the circuit, that is, when it is not being driven, a virtual infinite input impedance is provided to the input of the operational amplifier. As a result, the static offset output voltage which is inherent in operational amplifiers, when no input signal is being applied, is significantly reduced. Further, the offset due to saturation voltage mismatch in the input transistors of the driving circuits is eliminated. Also, the insertion of the transistors in an arrangement in accordance with this invention has the effect of standardizing the circuit. By "standardizing" is meant that standardized output signal levels are provided regardless of changes in time, temperature, and circuit components.

The novel features of the invention are set forth with particularity in the appended claims. The invention will best be understood from the following description when read in conjunction with the accompanying drawings.

DESCRIPTION OF THE PREFERRED EMBODIMENTS

Figure 1:
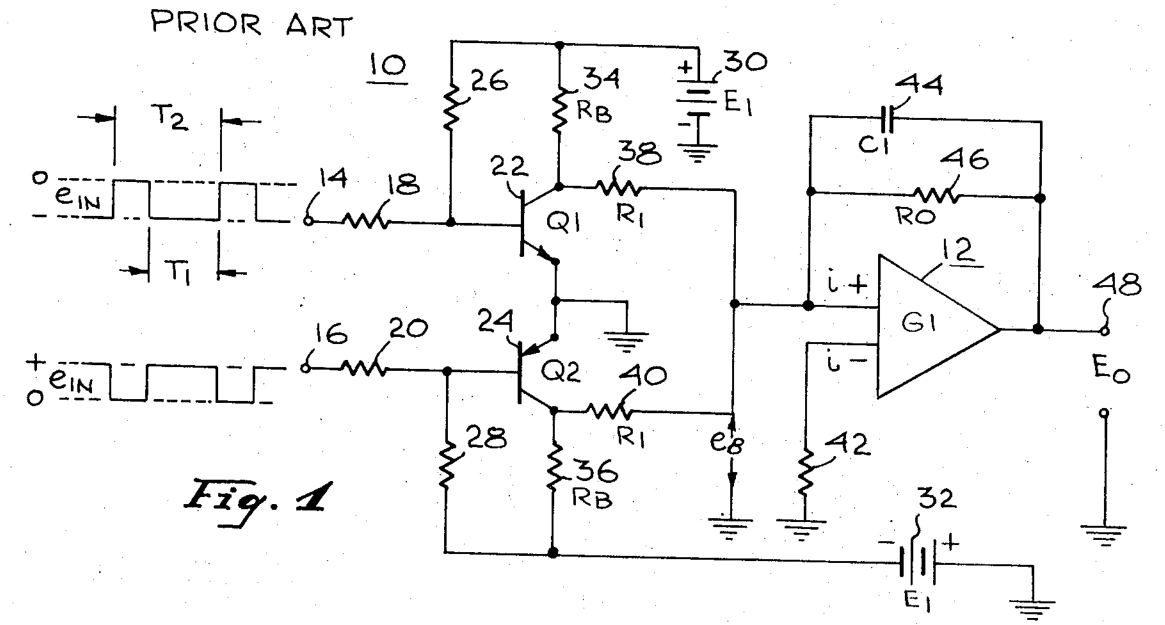
FIG. 1 is a drawing of a prior art digital-to-analog converter, shown to afford a better understanding of the present invention.

Referring now to FIG. 1, there may be seen a circuit diagram of a prior art approach to provide pulse width to amplitude conversion.

The converter has an input driven stage 10, which drives an operational amplifier 12. This circuit is made capable of handling both positive going and negative going pulses. The negative going pulses are applied to an input terminal 14. The positive going pulses are applied to an input terminal 16. These are connected through respective resistors 18, 20 to the bases of the respective transistors 22, 24.

The respective bases of transistors 22 and 24 are connected through respective resistors 26 and 28 to respective operating potential supplies 30, 32. The respective collectors of the respective transistors 22 and 24 are connected through respective resistors 34, 36 to the respective operating potential supplies 30, 32. The respective emitters of the respective transistors 22, 24 are connected to ground. The respective collectors of the respective transistors 22, 24 are connected through respective resistors 38, 40 to the positive input of the operational amplifier 12, which has a potential $e_B$ with respect to circuit ground and an input current indicated as $i_T$. The negative input terminal of the operational amplifier 12 is connected through a resistance 42 to ground and has an input current indicated as $i$.

The operational amplifier has a feedback capacitor 44 and a feedback resistor 46, both of which are respectively connected between the output terminal 48 and the positive input terminal of the amplifier 12.

The input pulses to the respective input terminals 14, 16 are represented by the pulse waveforms adjacent these terminals shown in FIG. 1. The total pulse width interval available for modulation is represented by $T_2$. The width of an input pulse is represented by $T_1$.

For the purposes of mathematically illustrating the advantages of this invention over the one shown in FIG. 1, certain formulas will be shown subsequently. The letters in these formulas are also reproduced on the drawing adjacent a particular component to which they refer. Thus, $Q_1$ and $Q_2$ represent respectively the transistors 22 and 24.

Under static or no input conditions, both $e_{in}^{(+)}$ and $e_{in}^{(-)}$ are at ground state; consequently the switching elements $Q_1$ and $Q_2$ are saturated. The output of the operational amplifier ($E_o$) now consists of error terms shown in Equation 1 below as No. 2, No. 3, and No. 4. In the presence of an $e_{in}^{(+)}$ or $e_{in}^{(-)}$ signal, transistor $Q_1$ or $Q_2$ is driven out of saturation, thus lifting the collector from ground potential, whereby current will flow in a path through either resistors 34 and 38 or resistors 36 and 40 into the input to the operational amplifier 12. The output voltage of the operational amplifier $G1=E_o$; then consists of terms No. 1 through No. 4 of Equation 1. Note that the values selected for $R_o$, $C_1$ are such that the resulting time constant is very much greater than $T_2$, so that $E_o$ is a DC signal with a minor AC component due to incomplete integration of $e_{in}$.

$$E_o=\overset{\text{Term No.1}}{\left[E_1\left(\frac{R_o}{R_B+R_1}\right)\cdot\frac{T_1}{T_2}\right]}+\overset{\text{Term No.2}}{\left[e_o\left(1+\frac{2R_o}{R_1}\right)\right]}+\overset{\text{Term No 3}}{[R_o\Delta i_o]}+\overset{\text{Term No.4}}{\left[\Delta V_{ce(sat)}\frac{R_o}{R_1}\right]} \quad (1)$$

where:

$R_1$=Input summing resistors;
$E_o$=Output of $D/A$ consisting of signal plus error terms;
$E_1$=Switch supply voltage;
$R_o$=Feedback resistor of G1;
$R_B$=Collector load resistor of $Q_1$ and $Q_2$;
$\Delta i_o=(1+-1-)$=Differential offset current of G1;
$e_o$=Offset input voltage of G1;
$V_{ce(sat)}=V_{ce\ sat}Q_1-V_{ce\ sat}Q_2$, where $V_{ce\ sat}$ is saturation voltage of $Q_1$ and $Q_2$;
$T_1$="Mark" Period of $e_{in}^{(+)}$ or $e_{in}^{(-)2}$;
$T_2$="Space" period of $e_{in}^{(+)}$ or $e_{in}^{(-)}$.

The first term describes the desired output signal as a function of $T_1$, $T_2$.

The second term gives the output static offset voltage due to the static offset input voltage to G1.

The third term gives the output static offset due to G1 offset input current.

The fourth term gives the output static offset due to mismatch of $V_{ce(sat)}$ of transistors $Q_1$ and $Q_2$. $V_{ce(sat)}$ is the saturated collector-emitter voltage.

Figure 2:
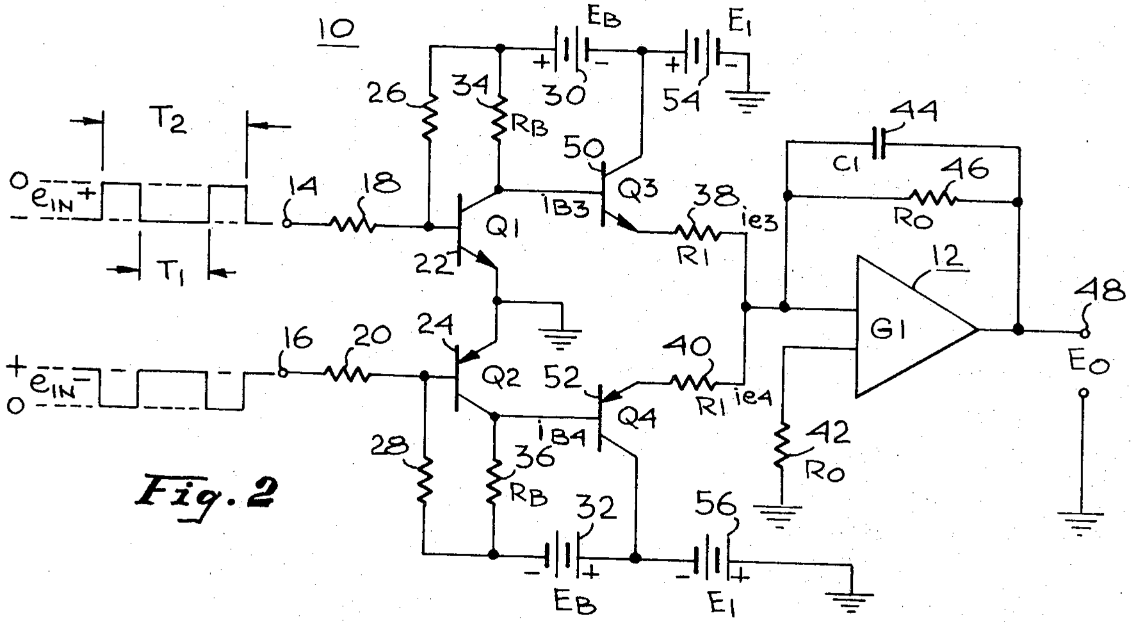
FIG. 2 is a circuit diagram of a digital-to-analog converter, in accordance with this invention.

FIG. 2 is a circuit diagram of an improved pulse modulation detection circuit in accordance with this invention. Circuit components which function similarly to those shown in FIG. 1 will bear the same reference numerals. In the improved circuit, two transistors respectively 50, 52 are connected between the resistors 34 and 38, and 40 and 36 respectively. That is, transistor 50 has its base connected to the collector of transistor 22 which receives a current indicated as $i_{B3}$; transistor 52 has its base connected to the collector of transistor 24; the respective emitters of transistors 50 and 52 are respectively connected to the resistors 38 and 40 having currents therethrough indicated as $i_{e4}$; the respective collectors of transistors 50 and 52 are respectively connected to the $E_B$ operating potential supplies 54 and 56; and the $E_1$ operating potential supplies are connected between the previous operating potential supplies, respectively 30 and 32, and ground.

An examination of the effect of the modification to the pulse width modulation detection circuit, provided by this invention, reveals the following. Assume no input signal is applied to either terminal 14 or 16. Then the transistors 22 and 24 or $Q_1$ and $Q_2$ are saturated. $V_{ce(sat)}$ for $Q_1$ and $Q_2$ is much smaller than $V_{be(on)}$ for $Q_3$ or $Q_4$. $V_{be(on)}$ is the base-to-emitter voltage. Consequently, transistors 50 and 52 are cut off. At this time, the impedance looking into transistors 50 and 52 from the operational amplifier 12 is essentially infinite and is defined as R1′, where $R1'=R1+R_{off}\approx R_{off}$. It should be noted that R1 is the resistance value of either of the summing resistors 38 or 40 and $R_{off}$ is the impedance looking into $Q_3$ and $Q_4$ emitters, where both stages are cut off.

Consider the No. 2 drift term shown in Equation 1. This is $$e_o\left(1+\frac{2R_o}{R_1}\right)$$

In the improved converter, the denominator becomes R1′, instead of R1. Since R1′ is very much greater than $R_o$, the No. 2 drift term reduces to ($e_o$).

The fourth error term $$V_{ce(sat)}\frac{R_o}{R_1}$$

reduces to zero since, with no input signal, the operating point of the amplifier 12 is completely independent of $V_{ce(sat)}$ of either transistors 22 or 24.

From the foregoing, it should be evident that one of the direct effects of the improvement, in accordance with this invention, is to significantly reduce the static offset error voltage inherent in the operational amplifier, as well as to eliminate the offset due to saturation voltage being present in the switching elements 22 and 24.

Figure 3:
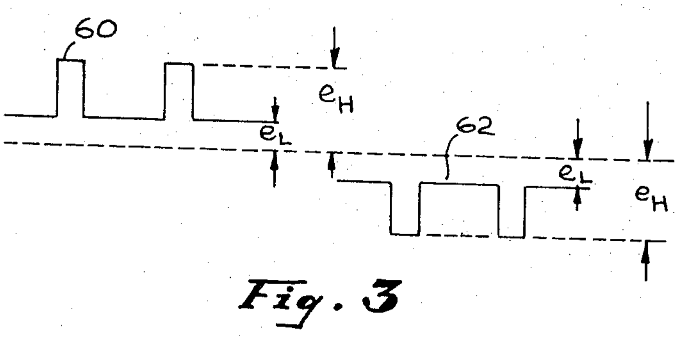
FIG. 3 is a waveshape shown to assist in an understanding of this invention.

If pulse width to amplitude conversion is to be undertaken with precision, the elements which drive the operational amplifier must provide standardized signal levels. By standardized signal levels is meant the establishment of fixed high and low state signal levels whose values are invariant with time, temperature, and device interchangeability. FIG. 3 illustrates waveforms, respectively 60 and 62, which indicate what is meant by a high state $e_H$ signal level and a low state $e_L$ signal level, which is derived from the output of the operational amplifier in the presence of a maximum driving signal for a high state signal level. The low state signal level represents the base line of any output signal.

In the conventional circuit, as shown in FIG. 1, the low state signal level $e_L=V_{ce(sat)}$ of either of the transistors 22 or 24. This is highly dependent upon temperature drift, transistor interchangeability, and to a lesser extent upon time.

In the improved circuit, shown in FIG. 2, $e_L$ is determined only by the operational amplifier input offset, since the switching elements 50, 52 are cut off in the low state.

In the conventional circuit, the high state level depends upon $i_{CBO}$ of $Q_1$; $i_{CBO}$ of $Q_1$ is the collector base leakage current. The high state level is thus determined as:

$$\frac{(E_1-i_{CBO(Q1)}R_B)R_1}{R_1+R_B}$$

$$i_{B3}=i_{E3}\left[1+\left(\frac{\alpha N}{\alpha 1}\right)\left(\frac{1-\alpha 1}{1-\alpha N}\right)\right]$$

where, as shown in FIG. 2, $i_{B3}$ is the current flowing out of the base of transistor 50 and $i_{E3}$ is the current flowing out of the emitter of transistor 50. αN is equal to the normal α of the transistor and α1 is the inverted α of the transistor.

The preceding equation defines the exact base current required to make $V_{ce(sat)}$ of transistor 50 equal to zero. $V_{ce(sat)}$ of transistor 50 will be on the order of a few millivolts if $i_B$ is equal to or greater than $i_E$. This requires that both emitter-to-base and collector-to-base junctions be forward biased. Under this condition, $$V_{ce}=V_{BE}-V_{BC}\text{ and also }\frac{V_{ce}}{\Delta T}=\frac{V_{BE}}{\Delta T}-\frac{V_{BC}}{\Delta T}$$

where $\Delta V/\Delta T$ is the rate of change of voltage with respect to temperature.

There has accordingly been described and shown above a novel, simple and improved pulse width modulation to amplitude modulation circuit having an input circuit which performs a standardization with a high degree of stability and at the same time minimizes the effect of operational amplifier drift. This is done without using matched diodes or chopper transistors or any of the other expedients which are expensive and which have been used heretofore in an attempt to accomplish this.

Although particular embodiments of the invention have been described and illustrated herein, it is recognized that modifications and variations may readily occur to those skilled in the art, and consequently it is intended that the claims be interpreted to cover such modifications and equivalents.

The embodiments of the invention in which an exclusive property or privilege is claimed are defined as follows:

1. A pulse width to amplitude converter circuit comprising:
   an operational amplifier having an input and an output, and
   driving circuit means connected to said input for driving said operational amplifier in response to pulse width modulated pulses,
   said driving circuit means including means in the absence of a pulse width modulated signal being applied to said driving circuit means to present substantially an infinite impedance to said operational amplifier input and in the presence of pulse width modulated signals being applied to said driving circuit means to apply said signals to said operational amplifier input.

2. A pulse width to amplitude converter circuit comprising:
   an operational amplifier having an input and an output,
   input transistor means for applying pulse width modulated signals to said operational amplifier input in response to pulse width modulation signals being applied thereto,
   bias means for maintaining said input transistor means in saturation in the absence of pulse width modulation signals being applied thereto, and
   coupling means between said input transistor means and said operational amplifier for minimizing operational amplifier static offset and offset due to said input transistor means being in saturation.

3. A pulse width to amplitude converter circuit as recited in claim 2, wherein said input transistor means includes a first transistor having a base, emitter and collector electrode, said coupling means includes a second transistor having a base, emitter and collector electrode,
   means for coupling said first transistor collector to said second transistor base,
   means for coupling said second transistor emitter to said operational amplifier input,
   first means for applying operating potential to said first transistor collector and emitter,
   means for applying biasing potential to said first transistor base to maintain it in saturation in the absence of pulse width modulated signals being applied to its base, and
   second means for applying operating potential to said second transistor collector and emitter electrodes.

4. A pulse width amplitude converter circuit as recited in claim 3, wherein:
   said first means for applying operating potential to said first transistor includes a first resistor,
   said means for applying biasing potential to said first transistor base includes a second resistor, and
   said means for coupling said second transistor emitter to said operational amplifier input includes a third resistor.

5. In a circuit for converting pulse width modulation to amplitude modulation, of the type wherein a first and second transistor each having base, emitter and collector electrodes have input signals applied to their bases, have operating potential applied between their collectors and emitters, and have their collectors connected through summing resistors to the input of an operational amplifier, the improvement comprising:
   a third and fourth transistor each having base, collector and emitter electrodes,
   said third transistor base being connected to said first transistor collector,
   said fourth transistor base being connected to said second transistor collector,
   said third and fourth transistor emitters being respectively connected to said summing resistors, and
   said third and fourth transistor collectors being connected to said operating potential.

6. A pulse width to amplitude converter comprising:
   a first and a second input terminal,
   a first, second, third and fourth transistor each having emitter, collector and base electrodes,
   means connecting the base of the first of said transistors to said first input terminal,
   means connecting the base of the second of said transistors to the second input terminal,
   means connecting the emitters of said first and second transistors together,
   means for applying operating potential between the collectors of said first and second transistors and their emitters,
   means biasing said first and second transistors to their saturated state in the absence of an input signal,
   means connecting the collector of said first transistor to the base of said third transistor,
   means connecting the collector of said second transistor to the base of said fourth transistor,
   means for applying operating potential to the collectors of said third and fourth transistors,
   an operational amplifier having an input and an output,
   means connecting the third and fourth transistor emitters to said operational amplifier input, and
   means for deriving an output from said operational amplifier.

7. A pulse width to amplitude converter as recited in claim 6, wherein:
   said means connecting the bases of said first and second transistors respectively to the first and second input terminals respectively comprise first and second resistors, and
   said means coupling the emitters of said third and fourth transistors to the operational amplifier input comprise third and fourth resistors.

8. A pulse width to amplitude converter comprising:
   a first and second transistor means,
   means for biasing said first and second transistor means to their saturated state in the absence of input signals,
   means for applying signals to said first and second transistor means to drive them into their unsaturated state in response to said signals,
   a third and fourth transistor means, each having a base, emitter and collector electrode,
   means for applying an output from said first transistor means to the base of said third transistor means,
   means for applying an output from said second transistor means to the base of said fourth transistor means,
   an operational amplifier having an input and an output,
   resistance means connecting the emitters of said third and fourth transistor means to said operational amplifier input, and
   means for applying operating potential to the collectors of said third and fourth transistor means.

9. A converter as recited in claim 8, wherein said first and third transistor means are of the NPN type and said second and fourth transistor means are of the PNP type.

10. In a pulse width to amplitude converter circuit of the type including first and second transistors which are respectively driven from saturated to unsaturated states in response to opposite polarity pulses respectively applied thereto, means for driving an operational amplifier responsive to output signals derived from said first and second transistors, said means for driving comprising:
   a third and fourth transistor each having collector, emitter and base electrodes,
   means for applying output signals from said first and second transistors to the respective bases of said third and fourth transistors,
   means for applying operating potential to the respective collectors of said third and fourth transistors,
   first and second summing resistors, each having one end connected to said operational amplifier, and
   means connecting the respective other ends of said summing resistors to the respective emitters of said third and fourth transistors.

References Cited

UNITED STATES PATENTS

| | | | |
|---|---|---|---|
| 3,087,156 | 4/1963 | D'Onofrio et al. | 325—41X |
| 3,171,975 | 3/1965 | Ashley et al. | 328—58X |
| 3,246,247 | 4/1966 | Grindle | 332—9TUX |
| 3,384,838 | 5/1968 | Knutrud | 332—9T |

ALFRED L. BRODY, Primary Examiner

U.S. Cl. X.R.

307—265; 325—142; 328—34, 58; 330—9; 332—9, 41

PO-1050
(5/69)

UNITED STATES PATENT OFFICE
CERTIFICATE OF CORRECTION

Patent No. 3,562,673 Dated February 9, 1971

Inventor(s) Frederick W. Caspari

It is certified that error appears in the above-identified patent and that said Letters Patent are hereby corrected as shown below:

Column 4, Lines 35-40 After "$\frac{(E_1 - i_{CBO(Q1)} R_B) R_1}{R_1 + R_B}$" insert --- In the improved circuit, the hig state level is exactly equal to $E_1$ i Signed and sealed this 15th day of June 1971.

(SEAL)
Attest:

EDWARD M.FLETCHER,JR.
Attesting Officer

WILLIAM E. SCHUYLER, J
Commissioner of Patent